(12) United States Patent
Han et al.

(10) Patent No.: US 10,276,550 B2
(45) Date of Patent: Apr. 30, 2019

(54) LIGHT EMITTING DIODE DISPLAY AND MANUFACTURE METHOD THEREOF

(71) Applicant: Shenzhen China Star Optoelectronics Technology Co., Ltd., Shenzhen (CN)

(72) Inventors: Baixiang Han, Shenzhen (CN); Poyen Lu, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 75 days.

(21) Appl. No.: 15/519,839

(22) PCT Filed: Mar. 16, 2017

(86) PCT No.: PCT/CN2017/076861
§ 371 (c)(1),
(2) Date: Apr. 18, 2017

(87) PCT Pub. No.: WO2018/152895
PCT Pub. Date: Aug. 30, 2018

(65) Prior Publication Data
US 2018/0301442 A1    Oct. 18, 2018

(30) Foreign Application Priority Data

Feb. 24, 2017   (CN) .......................... 2017 1 0104787

(51) Int. Cl.
*H01L 25/16* (2006.01)
*H01L 27/12* (2006.01)
(Continued)

(52) U.S. Cl.
CPC .......... *H01L 25/167* (2013.01); *H01L 27/124* (2013.01); *H01L 27/1248* (2013.01);
(Continued)

(58) Field of Classification Search
CPC ............... H01L 27/167; H01L 27/1248; H01L 27/1262; H01L 33/405; H01L 33/42; H01L 33/44; H01L 33/62
See application file for complete search history.

(56) References Cited

U.S. PATENT DOCUMENTS

2002/0080597 A1*  6/2002  Coghlan .............. G02B 6/0061
                                                        362/603
2011/0156066 A1*  6/2011  Yao .......................... H01L 33/32
                                                        257/89
(Continued)

FOREIGN PATENT DOCUMENTS

CN          1822384 A     8/2006
CN        101101391 A     1/2008
(Continued)

*Primary Examiner* — Phuc Dang
(74) *Attorney, Agent, or Firm* — Leong C. Lei

(57) ABSTRACT

The present invention provides a light emitting diode display and a manufacture method thereof. The manufacture method of the light emitting diode forms the first anode covering the first through hole and possessing the reflection property on the planarization layer, and can use the reflection property of the first anode to gather and reflect the divergent light emitted by the light emitting diode located inside the first through hole to raise the light utilization and to promote the display quality. The light emitting diode of the present invention locates the first anode covering the first through hole and possessing the reflection property on the planarization layer, and can use the reflection property of the first anode to gather and reflect the divergent light emitted by the light emitting diode located inside the first through hole to raise the light utilization and to promote the display quality.

13 Claims, 7 Drawing Sheets

(51) Int. Cl.
*H01L 33/40* (2010.01)
*H01L 33/44* (2010.01)
*H01L 33/62* (2010.01)
*H01L 33/42* (2010.01)
*H01L 51/52* (2006.01)
*H01L 51/56* (2006.01)

(52) U.S. Cl.
CPC ........ *H01L 27/1262* (2013.01); *H01L 33/405* (2013.01); *H01L 33/42* (2013.01); *H01L 33/44* (2013.01); *H01L 33/62* (2013.01); *H01L 51/5209* (2013.01); *H01L 51/5271* (2013.01); *H01L 51/56* (2013.01); *H01L 2933/0016* (2013.01); *H01L 2933/0025* (2013.01); *H01L 2933/0066* (2013.01)

(56) References Cited

U.S. PATENT DOCUMENTS

2014/0175465 A1* 6/2014 Lee .................. H01L 27/15
257/88
2015/0348735 A1* 12/2015 Kang ................ H01J 9/247
313/623

FOREIGN PATENT DOCUMENTS

| CN | 104871231 A | 8/2015 |
| CN | 106206672 A | 12/2016 |

\* cited by examiner

LIGHT EMITTING DIODE DISPLAY AND MANUFACTURE METHOD THEREOF

FIELD OF THE INVENTION

The present invention relates to a display technology field, and more particularly to a light emitting diode display and a manufacture method thereof.

BACKGROUND OF THE INVENTION

With the progress of the technology, various display products have already been developed in the market, such as the Liquid Crystal Display (LCD), the Plasma Display Panel (PDP) and the Light Emitting Diode display (LED display). The LED display possesses the advantages of high luminous efficiency, long life and low energy consumption, and has been widely applied for the outdoor displays and the large outdoor billboards, and also exists in the displays of the home television and the computer.

The light emitting diode display is a display screen with a way of controlling the display of the semiconductor light emitting diode for showing kinds of information, such as words, graphics, images, animation, quotes, video and recording tape signals.

The technological progress of light emitting diodes is the biggest driving force to expand the market demand and application. At first, the light emitting diode is only used for micro indicator to be applied in the high-end equipments of the computer, audio and video recorders. With the development of large scale integrated circuits and computer technology, the light emitting diode displays are rapidly rising and gradually expanded in the fields of stock quotes, digital cameras, personal digital assistant (PDA), and mobile phones.

The LED display integrates the microelectronics technology, the computer technology, the information process in one, and possesses advantages of colorfulness, wide dynamic range, high brightness, high resolution, low operating voltage, low power consumption, long life, impact resistance, and stable and reliable work to become the new generation display media with the most advantage. The light emitting diode display has been widely applied in the large square, commercial advertisement, sports venues, information dissemination, press release and securities trade for satisfying requirements of various environments.

FIG. 1 is a structure diagram of a light emitting diode display according to prior art. As shown in FIG. 1, the light emitting diode display comprises a substrate 100, a thin film transistor (TFT) layer 200 located on the substrate 100, a first planarization layer 300 located on the TFT layer 200, a first anode 400 located on the first planarization layer 300, a second planarization layer 500 located on the first anode 400 and the first planarization layer 300, a first through hole 510 being located in the second planarization layer 500 and exposing the first anode 400, a light emitting diode 600 located inside the first through hole 51, a cathode insulation layer 720, which is around the light emitting diode 600 and on the first anode 400, located inside the first through hole 510, and a first cathode 730 located on the cathode insulation layer 720, the light emitting diode 600 and the second planarization layer 500;

the light emitting diode 600 comprises a luminous lamp 610 and a second anode 620 and a second cathode 630 respectively connected to two ends of the luminous lamp 610, and the second anode 620 connects with the first anode 400, and the second cathode 630 contacts with the first cathode 730, and the first anode 400 and the first cathode 730 are insulated by the cathode insulation layer 720.

In the aforesaid light emitting diode, the light emitted by the light emitting diode 600 possesses the divergent property, and the second planarization layer 500, where the light emitting diode 600 is located, is generally manufactured with the transparent organic photoresist material, thus the second planarization layer 500 cannot gather and reflect the divergent light emitted by the light emitting diode 600 to lead to the light leakage, to reduce the light utilization and to raise the display energy consumption.

SUMMARY OF THE INVENTION

An objective of the present invention is to provide a manufacture method of a light emitting diode display, which can raise the light utilization of the light emitting diode to promote the display quality.

Another objective of the present invention is to provide a light emitting diode display, of which the light utilization is better to possess the better display quality.

For realizing the aforesaid objectives, the present invention first provides a manufacture method of a light emitting diode display, comprising steps of:

step 1, providing a TFT backplate, and the TFT backplate comprising a substrate, a TFT layer located on the substrate, a planarization layer located on the TFT layer and a first through hole located in the planarization layer; the TFT layer comprising a drain correspondingly located under the first through hole;

step 2, forming a first anode on the planarization layer, and the first anode covering the first through hole and contacting with the drain via the first through hole, and the first anode being a reflective electrode;

step 3, providing a light emitting diode, and the light emitting diode comprising a luminous lamp and a second anode and a second cathode respectively connected to two ends of the luminous lamp;

transferring the light emitting diode into the first through hole of the TFT backplate, and connecting the second anode of the light emitting diode with the first anode of the TFT backplate;

step 4, forming a cathode insulation layer, which is around the light emitting diode, on the first anode and the planarization layer, and a portion of the cathode insulation layer, which is located inside the first through hole, completely covering the second anode and at least exposing a top end of the second cathode;

step 5, forming a first cathode on the cathode insulation layer and the light emitting diode, and the first cathode contacting with the second cathode, and the first cathode and the first anode being insulated by the cathode insulation layer.

The TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes.

A material of the first anode is metal.

A material of the first anode comprises one or more of molybdenum, aluminum, copper, titanium and chromium.

A material of the cathode insulation layer is organic insulation material; the first cathode is a transparent electrode.

The present invention further provides a light emitting diode display, comprising a substrate, a TFT layer located on the substrate, a planarization layer located on the TFT layer, a first through hole located in the planarization layer, a first anode being located on the planarization layer and covering the first through hole, a light emitting diode located inside the first through hole and on the first anode, a cathode insulation layer located on the first anode and the planarization layer and around the light emitting diode, and a first cathode located on the cathode insulation layer and the light emitting diode;

the TFT layer comprising a drain correspondingly located under the first through hole, and the first anode contacting with the drain via the first through hole;

the light emitting diode comprising a luminous lamp and a second anode and a second cathode respectively connected to two ends of the luminous lamp, and the second anode connecting with the first anode, and the second cathode contacting with the first cathode;

a portion of the cathode insulation layer, which is located inside the first through hole, completely covering the second anode and at least exposing a top end of the second cathode, and the first anode and the first cathode being insulated by the cathode insulation layer;

the first anode is a reflective electrode.

The TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes.

A material of the first anode is metal.

A material of the first anode comprises one or more of molybdenum, aluminum, copper, titanium and chromium.

A material of the cathode insulation layer is organic insulation material; the first cathode is a transparent electrode.

The present invention further provides a light emitting diode display, comprising a substrate, a TFT layer located on the substrate, a planarization layer located on the TFT layer, a first through hole located in the planarization layer, a first anode being located on the planarization layer and covering the first through hole, a light emitting diode located inside the first through hole and on the first anode, a cathode insulation layer located on the first anode and the planarization layer and around the light emitting diode, and a first cathode located on the cathode insulation layer and the light emitting diode;

the TFT layer comprising a drain correspondingly located under the first through hole, and the first anode contacting with the drain via the first through hole;

the light emitting diode comprising a luminous lamp and a second anode and a second cathode respectively connected to two ends of the luminous lamp, and the second anode connecting with the first anode, and the second cathode contacting with the first cathode;

a portion of the cathode insulation layer, which is located inside the first through hole, completely covering the second anode and at least exposing a top end of the second cathode, and the first anode and the first cathode being insulated by the cathode insulation layer;

the first anode is a reflective electrode;

wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;

wherein a material of the first anode is metal.

The benefits of the present invention are: the present invention provides a manufacture method of a light emitting diode, and the method forms the first anode covering the first through hole and possessing the reflection property on the planarization layer, and can use the reflection property of the first anode to gather and reflect the divergent light emitted by the light emitting diode located inside the first through hole to raise the light utilization and to promote the display quality. The light emitting diode provided by the present invention locates the first anode covering the first through hole and possessing the reflection property on the planarization layer, and can use the reflection property of the first anode to gather and reflect the divergent light emitted by the light emitting diode located inside the first through hole to raise the light utilization and to promote the display quality.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
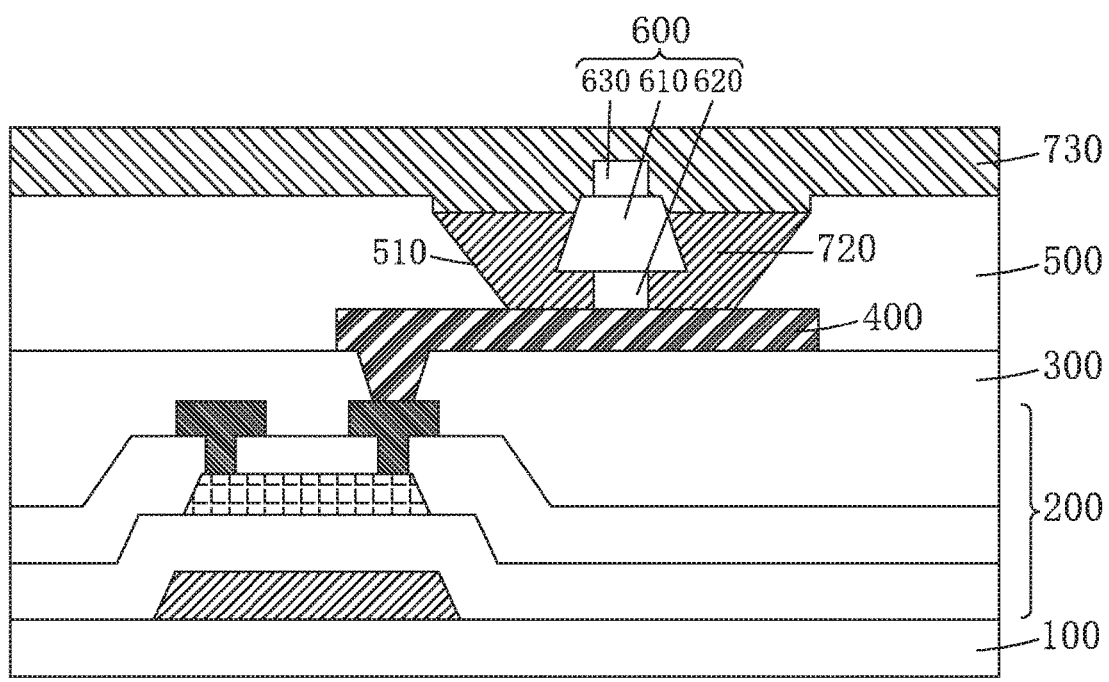
FIG. 1 is a structure diagram of a light emitting diode display according to prior art.
Figure 2:
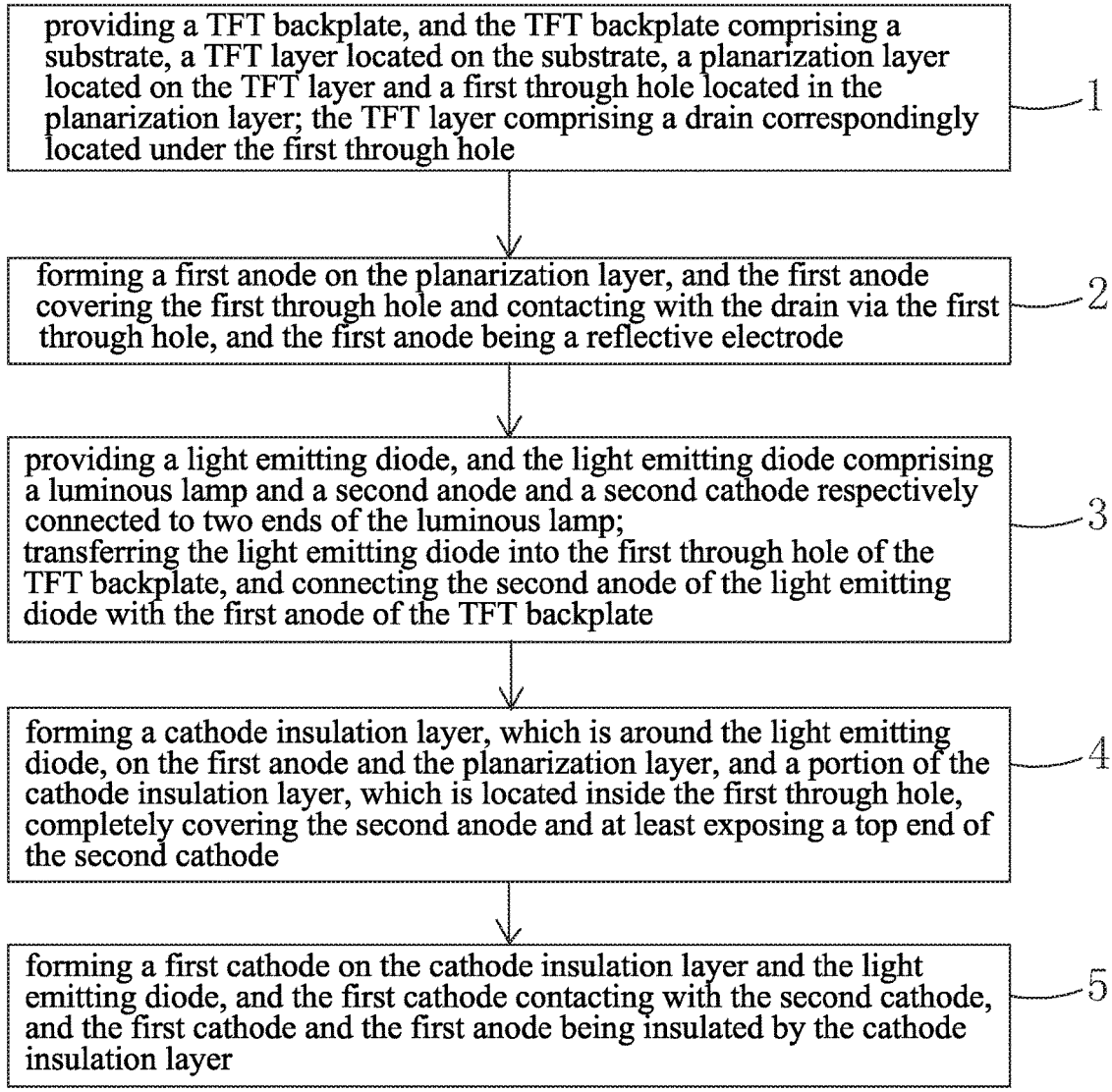
FIG. 2 is a flowchart of a manufacture method of a light emitting diode display according to the present invention.
Figure 3:
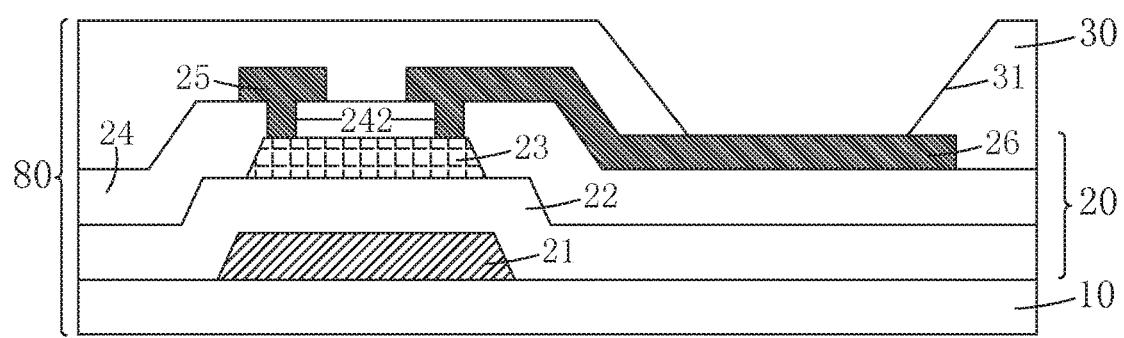
FIG. 3 is a diagram of step 1 of a manufacture method of a light emitting diode display according to the present invention.

Please refer to FIG. 2, the present invention first provides a manufacture method of a light emitting diode display, comprising steps of:

step 1, as shown in FIG. 3, providing a TFT backplate 80, and the TFT backplate 80 comprising a substrate 10, a TFT layer 20 located on the substrate 10, a planarization layer 30 located on the TFT layer 20 and a first through hole 31 located in the planarization layer 30; the TFT layer 20 comprising a drain 26 correspondingly located under the first through hole 31.

Figure 4:
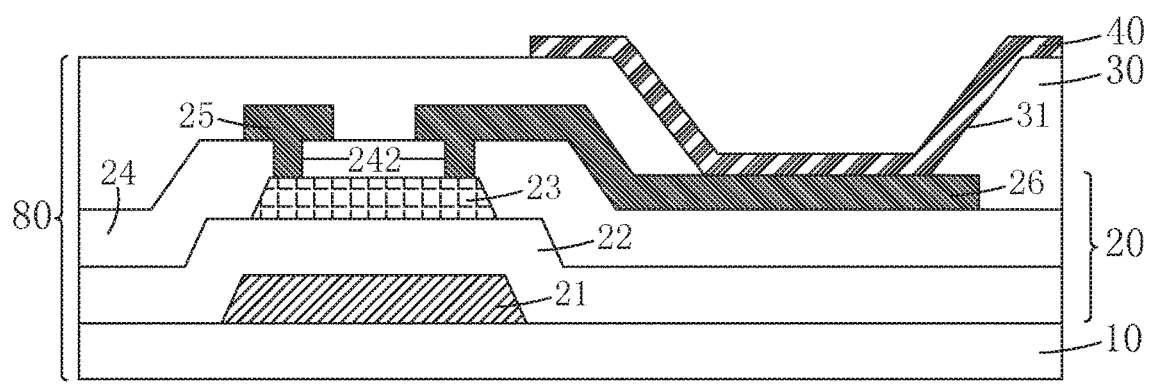
FIG. 4 is a diagram of step 2 of a manufacture method of a light emitting diode display according to the present invention.

Specifically, the TFT layer 20 comprises a gate 21 located on the substrate 10, a gate protection layer 22 on the gate 21 and the substrate 10, an active layer 23 located on the gate protection layer 22, an etching stopper layer 24 located on the active layer 23 and the gate protection layer 22, and a source 25 and a drain 26 located on the etching stopper layer 24, and second through holes 242 respectively corresponding to two ends of the active layer 23 are configured in the etching stopper layer 24, and the source 25 and the drain 26 contact with the two ends of the active layer 23 respectively via the second through holes 242.

step 2, as shown in FIG. 4, forming a first anode 40 on the planarization layer 30, and the first anode 40 covering the first through hole 31 and contacting with the drain 26 via the first through hole 31, and the first anode 40 being a reflective electrode.

Specifically, a material of the first anode 40 is metal.

Figure 5:
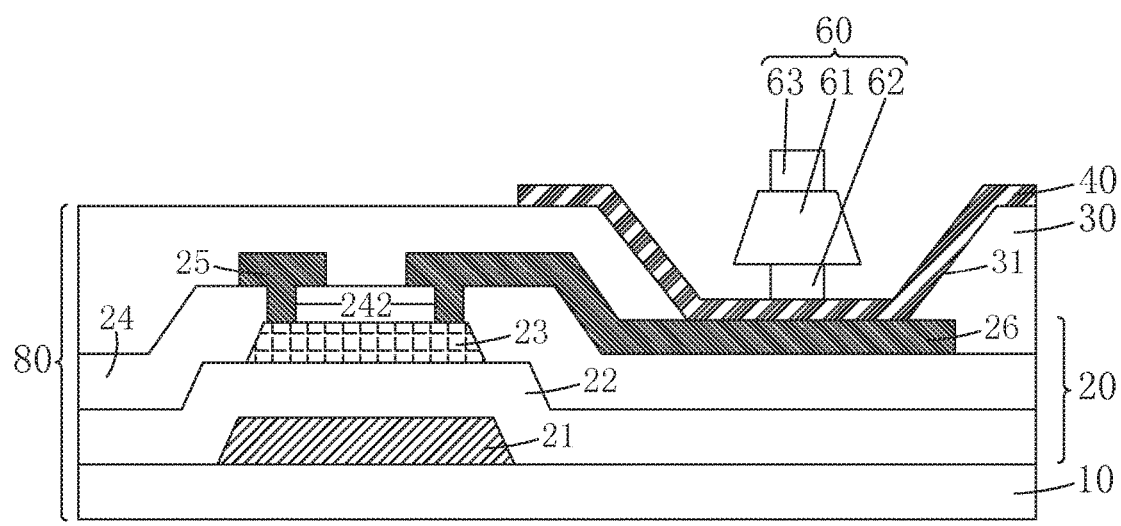
FIG. 5 is a diagram of step 3 of a manufacture method of a light emitting diode display according to the present invention.

Preferably, the material of the first anode 40 comprises one or more of molybdenum (Mo), aluminum (Al), copper (Cu), titanium (Ti) and chromium (Cr).

step 3, as shown in FIG. 5, providing a light emitting diode 60, and the light emitting diode 60 comprising a luminous lamp 61 and a second anode 62 and a second cathode 63 respectively connected to two ends of the luminous lamp 61;

transferring the light emitting diode 60 into the first through hole 31 of the TFT backplate 80, and connecting the second anode 62 of the light emitting diode 60 with the first anode 40 of the TFT backplate 80.

Specifically, in step 3, welding is used to connect the second anode 62 of the light emitting diode 60 with the first anode 40 of the TFT backplate 80.

Figure 6:
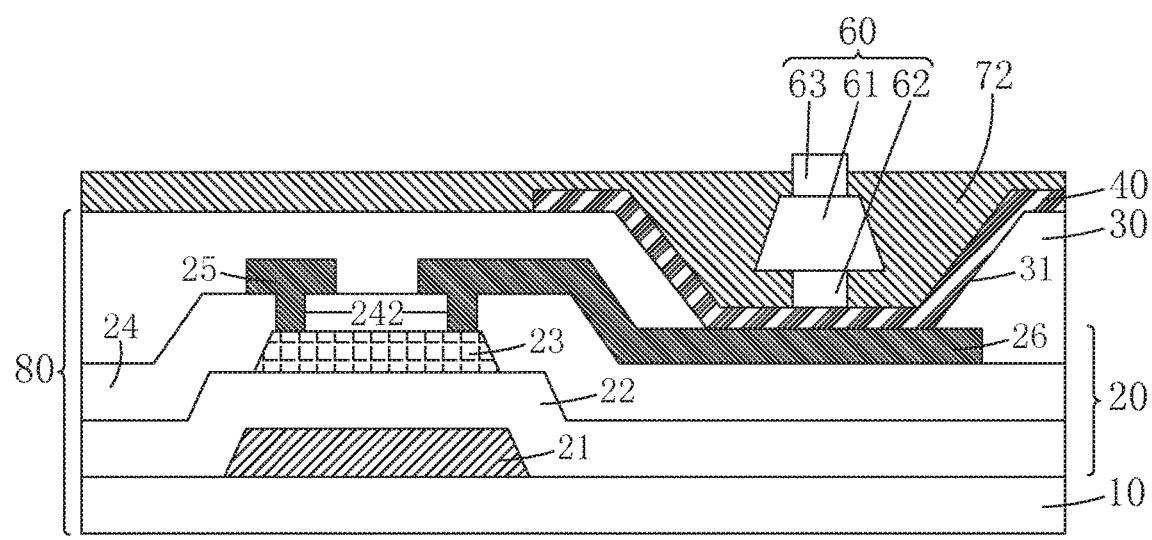
FIG. 6 is a diagram of step 4 of a manufacture method of a light emitting diode display according to the present invention.

Because the first anode 40 is a reflective electrode, it can gather and reflect the divergent light emitted by the light emitting diode 60 to raise the light utilization.

step 4, as shown in FIG. 6, forming a cathode insulation layer 72, which is around the light emitting diode 60, on the first anode 40 and the planarization layer 30, and a portion of the cathode insulation layer 72, which is located inside the first through hole 31, completely covering the second anode 62 and at least exposing a top end of the second cathode 63.

The cathode insulation layer 72 is insulation material. Thus, the first anode 40 can be insulated from the first cathode 73 manufactured thereafter to prevent the short circuit.

Specifically, in step 4, ink jet printing can be used to form the cathode insulation layer 72, or a combination of the organic material coating process and the photolithography process can be used to form the cathode insulation layer 72.

Figure 7:
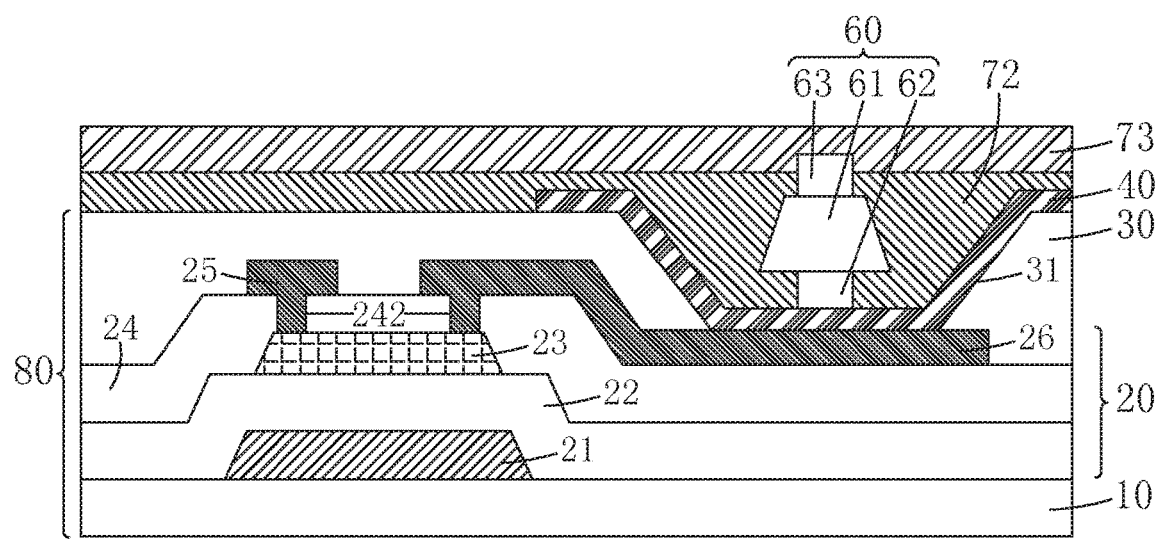
FIG. 7 is a diagram of step 5 of a manufacture method of a light emitting diode display according to the present invention and also a structure diagram of a light emitting diode display according to the present invention.

Preferably, a material of the cathode insulation layer 72 is organic insulation material.

step 5, as shown in FIG. 7, forming a first cathode 73 on the cathode insulation layer 72 and the light emitting diode 60, and the first cathode 73 contacting with the second cathode 63, and the first cathode 73 and the first anode 40 being insulated by the cathode insulation layer 72.

Specifically, in step 5, evaporation is used to form the first cathode 73.

Specifically, the first anode 73 is a transparent electrode.

Preferably, a material of the first cathode 73 is transparent conductive metal oxide, such as indium tin oxide (ITO).

Under the circumstance that the first anode 40 is a reflective electrode and the first anode 73 is a transparent electrode, the light emitting diode of the present invention constructs the top emitting light emitting diode display, and one side of the first anode 73 is the illuminating surface.

The aforesaid manufacture method of the light emitting diode forms the first anode 40 covering the first through hole 31 and possessing the reflection property on the planarization layer 30, and can use the reflection property of the first anode 40 to gather and reflect the divergent light emitted by the light emitting diode 60 located inside the first through hole 31 to raise the light utilization and to promote the display quality.

Please refer to FIG. 7. On the basis of the aforesaid manufacture method of the light emitting diode display, the present invention further provides a light emitting diode display, comprising a substrate 10, a TFT layer 20 located on the substrate 10, a planarization layer 30 located on the TFT layer 20, a first through hole 31 located in the planarization layer 30, a first anode 40 being located on the planarization layer 30 and covering the first through hole 31, a light emitting diode 60 located inside the first through hole 31 and on the first anode 40, a cathode insulation layer 72 located on the first anode 40 and the planarization layer 30 and around the light emitting diode 60, and a first cathode 73 located on the cathode insulation layer 72 and the light emitting diode 60;

the TFT layer 20 comprising a drain 26 correspondingly located under the first through hole 31, and the first anode 40 contacting with the drain 26 via the first through hole 31;

the light emitting diode 60 comprising a luminous lamp 61 and a second anode 62 and a second cathode 63 respectively connected to two ends of the luminous lamp 61, and the second anode 62 connecting with the first anode 40, and the second cathode 63 contacting with the first cathode 73;

a portion of the cathode insulation layer 72, which is located inside the first through hole 31, completely covering the second anode 62 and at least exposing a top end of the second cathode 63, and the first anode 40 and the first cathode 73 being insulated by the cathode insulation layer 72;

The first anode 40 is a reflective electrode and can gather and reflect the divergent light emitted by the light emitting diode 60 to raise the light utilization.

Specifically, the TFT layer 20 comprises a gate 21 located on the substrate 10, a gate protection layer 22 on the gate 21 and the substrate 10, an active layer 23 located on the gate protection layer 22, an etching stopper layer 24 located on the active layer 23 and the gate protection layer 22, and a source 25 and a drain 26 located on the etching stopper layer 24, and second through holes 242 respectively corresponding to two ends of the active layer 23 are configured in the etching stopper layer 24, and the source 25 and the drain 26 contact with the two ends of the active layer 23 respectively via the second through holes 242.

Specifically, a material of the first anode 40 is metal.

Preferably, the material of the first anode 40 comprises one or more of molybdenum (Mo), aluminum (Al), copper (Cu), titanium (Ti) and chromium (Cr).

Preferably, a material of the cathode insulation layer 72 is organic insulation material.

Specifically, the first anode 73 is a transparent electrode.

Preferably, a material of the first cathode 73 is transparent conductive metal oxide, such as indium tin oxide (ITO).

The aforesaid light emitting diode locates the first anode 40 covering the first through hole 31 and possessing the reflection property on the planarization layer 30, and can use the reflection property of the first anode 40 to gather and reflect the divergent light emitted by the light emitting diode 60 located inside the first through hole 31 to raise the light utilization and to promote the display quality.

In conclusion, the present invention provides a light emitting diode display and a manufacture method thereof. The manufacture method of the light emitting diode according to the present invention forms the first anode covering the first through hole and possessing the reflection property on the planarization layer, and can use the reflection property of the first anode to gather and reflect the divergent light emitted by the light emitting diode located inside the first through hole to raise the light utilization and to promote the display quality. The light emitting diode of the present invention locates the first anode covering the first through hole and possessing the reflection property on the planarization layer, and can use the reflection property of the first anode to gather and reflect the divergent light emitted by the light emitting diode located inside the first through hole to raise the light utilization and to promote the display quality.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a light emitting diode display, comprising steps of:
    step 1, providing a TFT backplate, and the TFT backplate comprising a substrate, a TFT layer located on the substrate, a planarization layer located on the TFT layer and a first through hole located in the planarization layer; the TFT layer comprising a drain correspondingly located under the first through hole;
    step 2, forming a first anode on the planarization layer, and the first anode covering the first through hole and contacting with the drain via the first through hole, and the first anode being a reflective electrode;
    step 3, providing a light emitting diode, and the light emitting diode comprising a luminous lamp and a second anode and a second cathode respectively connected to two ends of the luminous lamp;
    transferring the light emitting diode into the first through hole of the TFT backplate, and connecting the second anode of the light emitting diode with the first anode of the TFT backplate;
    step 4, forming a cathode insulation layer, which is around the light emitting diode, on the first anode and the planarization layer, and a portion of the cathode insulation layer, which is located inside the first through hole, completely covering the second anode and at least exposing a top end of the second cathode;
    step 5, forming a first cathode on the cathode insulation layer and the light emitting diode, and the first cathode contacting with the second cathode, and the first cathode and the first anode being insulated by the cathode insulation layer.

2. The manufacture method of the light emitting diode display according to claim 1, wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes.

3. The manufacture method of the light emitting diode display according to claim 1, wherein a material of the first anode is metal.

4. The manufacture method of the light emitting diode display according to claim 3, wherein a material of the first anode comprises one or more of molybdenum, aluminum, copper, titanium and chromium.

5. The manufacture method of the light emitting diode display according to claim 1, wherein a material of the cathode insulation layer is organic insulation material; the first cathode is a transparent electrode.

6. A light emitting diode display, comprising a substrate, a TFT layer located on the substrate, a planarization layer located on the TFT layer, a first through hole located in the planarization layer, a first anode being located on the planarization layer and covering the first through hole, a light emitting diode located inside the first through hole and on the first anode, a cathode insulation layer located on the first anode and the planarization layer and around the light emitting diode, and a first cathode located on the cathode insulation layer and the light emitting diode;
    the TFT layer comprising a drain correspondingly located under the first through hole, and the first anode contacting with the drain via the first through hole;
    the light emitting diode comprising a luminous lamp and a second anode and a second cathode respectively connected to two ends of the luminous lamp, and the second anode connecting with the first anode, and the second cathode contacting with the first cathode;
    a portion of the cathode insulation layer, which is located inside the first through hole, completely covering the second anode and at least exposing a top end of the second cathode, and the first anode and the first cathode being insulated by the cathode insulation layer;
    the first anode is a reflective electrode.

7. The light emitting diode display according to claim 6, wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes.

8. The light emitting diode display according to claim 6, wherein a material of the first anode is metal.

9. The light emitting diode display according to claim 8, wherein a material of the first anode comprises one or more of molybdenum, aluminum, copper, titanium and chromium.

10. The light emitting diode display according to claim 6, wherein a material of the cathode insulation layer is organic insulation material; the first cathode is a transparent electrode.

11. A light emitting diode display, comprising a substrate, a TFT layer located on the substrate, a planarization layer located on the TFT layer, a first through hole located in the planarization layer, a first anode being located on the planarization layer and covering the first through hole, a light emitting diode located inside the first through hole and on the first anode, a cathode insulation layer located on the first anode and the planarization layer and around the light emitting diode, and a first cathode located on the cathode insulation layer and the light emitting diode;
 the TFT layer comprising a drain correspondingly located under the first through hole, and the first anode contacting with the drain via the first through hole;
 the light emitting diode comprising a luminous lamp and a second anode and a second cathode respectively connected to two ends of the luminous lamp, and the second anode connecting with the first anode, and the second cathode contacting with the first cathode;
 a portion of the cathode insulation layer, which is located inside the first through hole, completely covering the second anode and at least exposing a top end of the second cathode, and the first anode and the first cathode being insulated by the cathode insulation layer;
 the first anode is a reflective electrode;
 wherein the TFT layer comprises a gate located on the substrate, a gate protection layer on the gate and the substrate, an active layer located on the gate protection layer, an etching stopper layer located on the active layer and the gate protection layer, and a source and a drain located on the etching stopper layer, and second through holes respectively corresponding to two ends of the active layer are configured in the etching stopper layer, and the source and the drain contact with the two ends of the active layer respectively via the second through holes;
 wherein a material of the first anode is metal.

12. The light emitting diode display according to claim 11, wherein a material of the first anode comprises one or more of molybdenum, aluminum, copper, titanium and chromium.

13. The light emitting diode display according to claim 11, wherein a material of the cathode insulation layer is organic insulation material; the first cathode is a transparent electrode.

* * * * *